United States Patent
Korol et al.

(10) Patent No.: US 10,666,214 B2
(45) Date of Patent: May 26, 2020

(54) ULTRAFAST AND PRECISE GAIN CONTROL STEP IN RF AMPLIFIERS

(71) Applicant: Integrated Device Technology, Inc., San Jose, CA (US)

(72) Inventors: Victor Korol, San Diego, CA (US); Roberto Aparicio Joo, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 24 days.

(21) Appl. No.: 16/105,026

(22) Filed: Aug. 20, 2018

(65) Prior Publication Data

US 2019/0089319 A1    Mar. 21, 2019

Related U.S. Application Data

(60) Provisional application No. 62/559,854, filed on Sep. 18, 2017.

(51) Int. Cl.
| | | |
|---|---|---|
| *H03G 3/30* | (2006.01) | |
| *H03M 1/14* | (2006.01) | |
| *H03F 3/72* | (2006.01) | |
| *H03G 1/00* | (2006.01) | |
| *H03F 3/193* | (2006.01) | |
| *H03F 1/08* | (2006.01) | |
| *H03M 1/12* | (2006.01) | |

(52) U.S. Cl.
CPC ........... *H03G 3/3068* (2013.01); *H03F 1/083* (2013.01); *H03F 3/193* (2013.01); *H03F 3/72* (2013.01); *H03G 1/0029* (2013.01); *H03G 1/0088* (2013.01); *H03G 3/3036* (2013.01); *H03G 3/3042* (2013.01); *H03G 3/3063* (2013.01); *H03M 1/14* (2013.01); *H03F 2200/211* (2013.01); *H03F 2200/451* (2013.01); *H03G 2201/307* (2013.01); *H03M 1/124* (2013.01)

(58) Field of Classification Search
CPC .... H03G 3/3068; H03G 1/0023; H03G 3/001; H03G 1/0052; H03G 1/007; H03G 3/3015; H03G 1/0029; H03G 3/3042; H03G 3/3036; H03G 1/0088; H03G 3/3063; H03G 2201/307; H03M 1/124; H03M 1/14; H03F 2200/211; H03F 1/083; H03F 3/193; H03F 3/72; H03F 2200/451
USPC ................................ 330/129, 278, 279, 283
See application file for complete search history.

(56) References Cited

U.S. PATENT DOCUMENTS

| | | | |
|---|---|---|---|
| 9,755,595 B1 * | 9/2017 | Lin ...................... | H03G 1/0029 |
| 9,929,701 B1 * | 3/2018 | Noori ................... | C03B 37/0756 |
| 2013/0314164 A1 * | 11/2013 | Din ....................... | H03F 1/0205 |
| | | | 330/296 |

* cited by examiner

*Primary Examiner* — Khanh V Nguyen
(74) *Attorney, Agent, or Firm* — Christopher P. Maiorana, PC

(57) ABSTRACT

An apparatus includes an amplifier and a gain control circuit. The amplifier may be configured to provide multiple gain steps. The gain control circuit may be configured to provide fast and precise changes between the multiple gain steps of the amplifier. The gain control circuit may be further configured to change an impedance of the amplifier to switch between the gain steps. The gain control circuit may be further configured to compensate for changes in frequency response related to changing the impedance. The gain control circuit may be further configured to inject a complementary charge to an input of the amplifier to correct a bias voltage deviation and a transient caused by the gain control circuit.

20 Claims, 7 Drawing Sheets

ULTRAFAST AND PRECISE GAIN CONTROL STEP IN RF AMPLIFIERS

This application relates to U.S. Provisional Application No. 62/559,854, filed Sep. 18, 2017, which is hereby incorporated by reference in its entirety.

FIELD OF THE INVENTION

The invention relates to amplifiers generally and, more particularly, to a method and/or apparatus for implementing an ultrafast and precise gain control step in radio frequency (RF) amplifiers.

BACKGROUND

In many applications of radio frequency (RF) amplifiers, a gain control function that is able to set different values of signal gain is desirable. For example, radio receiver and transmitter systems often changes the receiver and transmitter gains in a wide range, depending on the proximity to other communication devices, channel conditions, etc. Moreover, a rapid and precise gain control step is desirable, especially in mobile communication systems.

It would be desirable to implement an ultrafast and precise gain control step in radio frequency (RF) amplifiers.

SUMMARY

The invention concerns an apparatus comprising an amplifier and a gain control circuit. The amplifier may be configured to provide multiple gain steps. The gain control circuit may be configured to provide fast and precise changes between the multiple gain steps of the amplifier. The gain control circuit may be further configured to change an impedance of the amplifier to switch between the gain steps. The gain control circuit may be further configured to compensate for changes in frequency response related to changing the impedance. The gain control circuit may be further configured to inject a complementary charge to an input of the amplifier to correct a bias voltage deviation and a transient caused by the gain control circuit.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for implementing an ultrafast and precise gain control step in radio frequency (RF) amplifiers that may (i) provide multiple gain levels, (ii) provide compensation over a frequency range, (iii) provide compensation over charge injection, (iv) reduce or eliminate bias disruption, (v) change an impedance of an amplifier to switch between multiple gain levels, (vi) provide ±½ dB step accuracy, (vii) provide a gain adjustment step accurate within 1 LSB of an associated analog-to-digital converter, (viii) provide switching speed within at least one of a conversion time, a frame time, or a slot time, and/or (ix) be implemented as one or more integrated circuits.

In various embodiments, a method and/or apparatus capable of achieving ultra-fast and precise gain change in a radio frequency (RF) amplifier is provided. The method and/or apparatus helps to reduce gain settling time and improve gain step precision under constraints related to variations in semiconductor process parameters, supply voltage, and operating temperature (commonly referred to as PVT variations).

Figure 1:
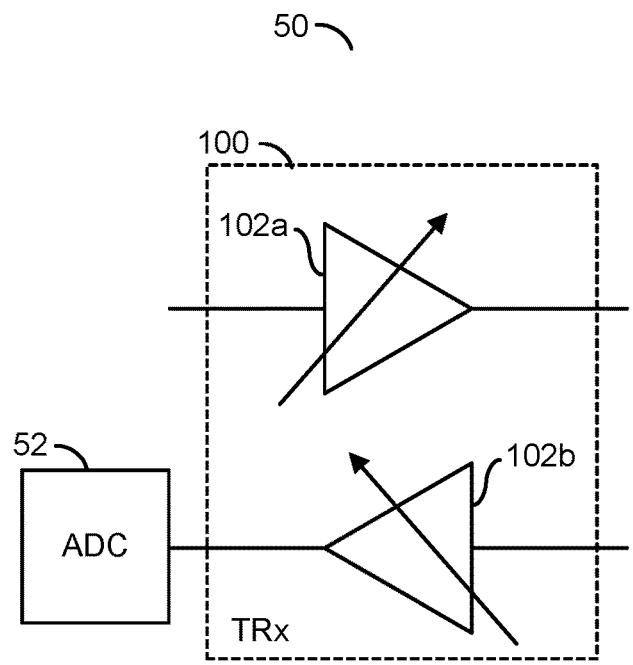
FIG. 1 is a diagram illustrating a context for implementing a gain control scheme in accordance with an example embodiment of the invention.

Referring to FIG. 1, a diagram illustrating a device 50 in a context in which a gain control scheme in accordance with an example embodiment of the invention may be implemented is shown. The device 50 may comprise a block (or circuit) 100 and/or a block (or circuit) 52. The circuit 100 may implement a transceiver. The circuit 52 may implement an analog-to-digital converter (ADC). The transceiver 100 may comprise a block (or circuit) 102a and/or a block (or circuit) 102b. The circuit 102a may implement a variable amplifier. The circuit 102b may implement a variable amplifier. The circuit 100 is shown connected to the ADC 52. The device 50 and/or the circuit 100 may comprise other components (not shown). The number type and/or arrangement of components of the device 50 and/or the transceiver 100 may be varied according to the design criteria of a particular implementation.

In an example application, the transceiver 100 may comprise the radio frequency (RF) amplifier 102a (e.g., as part of a transmitter chain) and the radio frequency (RF) amplifier 102b (e.g., as part of a receiver chain). The transmitter amplifier 102a and the receiver amplifier 102b may be generally implemented as variable gain amplifiers to allow the respective gains to change (e.g., over a wide range). The range of gains implemented may be varied depending on proximity to other communication devices, channel conditions, etc.

The transmitter amplifier 102a and the receiver amplifier 102b may be configured in accordance with an example embodiment of the invention to provide rapid and precise gain step changes. In an example, the transmitter amplifier 102a and/or the receiver amplifier 102b may be configured to provide a gain step with an accuracy on the order of ±½ dB. Generally, embodiments of the present invention may be implemented as the transmitter amplifier 102a and/or the receiver amplifier 102b.

In an embodiment where an output of the receiver amplifier 102b is fed to an input of the associated ADC 52, the receiver amplifier 102b may be configured to provide a gain adjustment step accuracy within a least significant bit (1 LSB) of the ADC 52. In an example, the transmitter amplifier 102a and/or the receiver amplifier 102b may be configured to provide a gain switching speed within at least one of a conversion time, a frame time, and/or a slot time of a respective telecommunication system.

Figure 2:
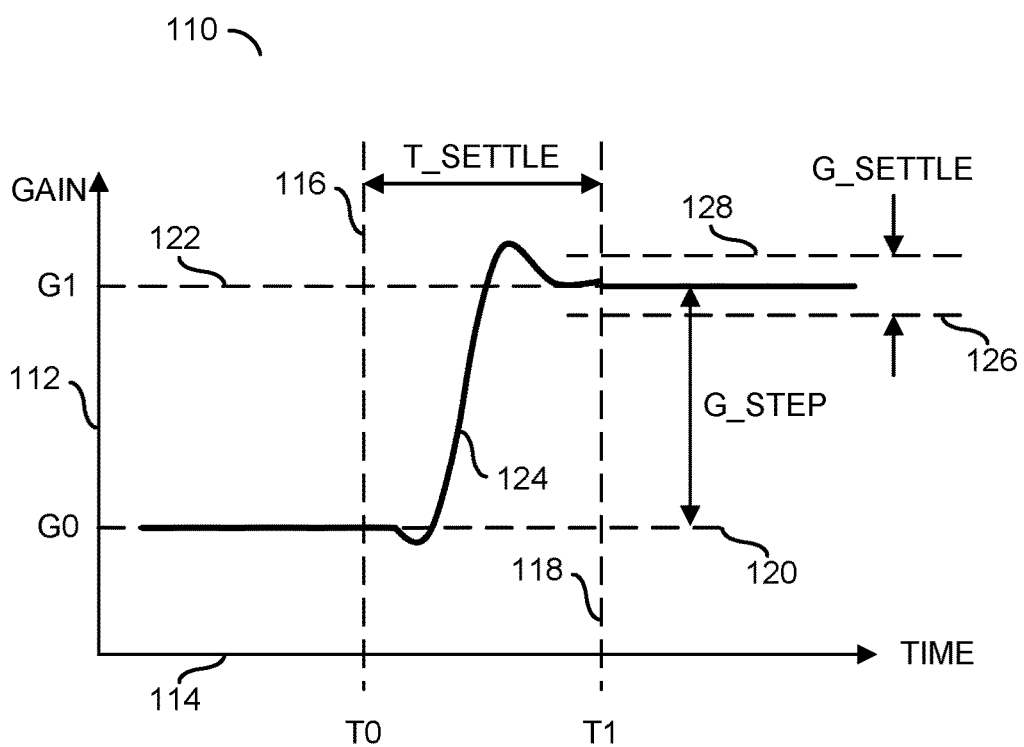
FIG. 2 is a diagram illustrating gain settling time and gain step precision.

Referring to FIG. 2, a diagram illustrating a graph 110 is shown. The graph 110 may illustrate gain settling time and gain step precision. The graph 110 may comprise an axis 112 and an axis 114. The axis 112 may represent a gain value. The axis 114 may represent a time value. A vertical line 116 and a vertical line 118 are shown on the graph 110. The line 116 may represent a time (e.g., T0). The line 118 may represent a time (e.g., T1). A horizontal line 120 and a horizontal line 122 are shown on the graph 110. The line 120 may represent a gain value (e.g., G0). The line 122 may represent a gain value (e.g., G1). For example, the gain value G0 may represent a lower gain step and the gain value G1 may represent a higher gain step.

A curve 124 is shown on the graph 110. The curve 124 may represent a gain value of the gain amplifiers 102a and/or 102b. In the example shown, the gain value of the curve 124 may be at the gain value (or step or level) G0 before the time T0. At the time T0, the gain of the curve 124 may initiate a step up to the gain value G1. At the time T1, the gain value of the curve 124 may be at the gain value G1.

A horizontal line 126 is shown below the line 122. A horizontal line 128 is shown above the line 122. A value (e.g., T_SETTLE) is shown between the time T0 and the time T1. A value (e.g., G_STEP) is shown between the gain value G0 and the gain value G1. A value (e.g., G_SETTLE) is shown between the line 126 and the line 128. The value G_SETTLE may represent a range around the gain value G1. In the example shown, during the time T_SETTLE, the curve 124 may increase a gain by the gain amount G_STEP.

In an example, a method of controlling gain step changes in accordance with an example embodiment of the invention generally helps to reduce a gain settling time (e.g., T_SETTLE) and improve a precision of a gain step (e.g., G_STEP). The gain settling time T_SETTLE may be defined as a period between the time T0, at which a gain step control signal changes state, and a time T1, at which an amplifier gain transitions from the initial gain level (e.g., G0) to the final desired gain level (e.g., G1), has settled to within a predefined range (e.g., G_SETTLE) of the final desired gain level G1. In one example, the range G_SETTLE may be approximately +½ dB accuracy of the gain step G1.

In an example, the amplifier gain (e.g., of the transmitter amplifier 102b) may be adjusted to maintain a particular signal level (e.g., within a range of the ADC 52, within an input range of a subsequent stage, etc.). In general, a step change should be accurate (e.g., within one least significant bit (LSB) of the ADC 52) to avoid distortion of the signal due to the gain change. The switch speed also should be within a conversion time (e.g., 30 ns) of the ADC 52, or within a frame time or a slot time of a particular telecommunications system.

Figure 3:
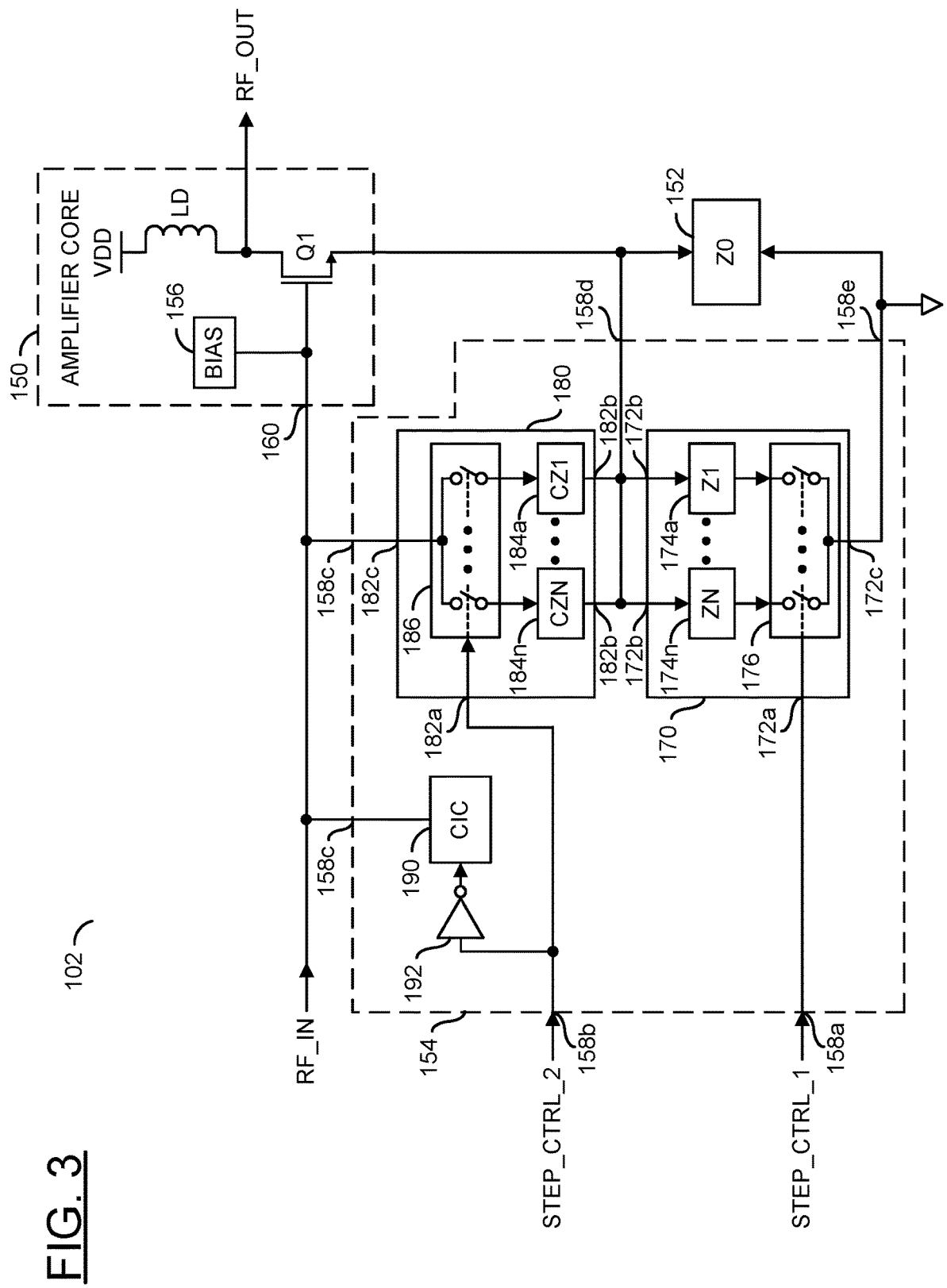
FIG. 3 is a diagram illustrating a generalized example of an amplifier circuit implementing an ultrafast and precise gain control scheme in accordance with an example embodiment of the invention.

Referring to FIG. 3, a diagram is shown illustrating a generalized example of an amplifier circuit 102 implementing an ultrafast and precise gain step control scheme in accordance with an example embodiment of the invention. For example the amplifier circuit 102 may be representative of one or more of the receiver amplifier 102a and/or the transmitter amplifier 102b shown in association with FIG. 1. In an example, the amplifier circuit 102 may be configured as a common source amplifier.

The amplifier 102 may comprise a block (or circuit) 150, a block (or circuit) 152 and/or a block (or circuit) 154. The circuit 150 may implement an amplifier core. The circuit 152 may implement a source degeneration impedance. The circuit 154 may implement a gain step control circuit. The amplifier 102 may comprise other components (not shown). The number, type and/or arrangement of the components of the amplifier 102 may be varied according to the design criteria of a particular implementation.

The amplifier 102 may receive a signal (e.g., RF_IN), a signal (e.g., STEP_CTRL_1) and/or a signal (e.g., STEP_CTRL_2). The signal RF_IN may be received by the amplifier core 150. For example, the signal RF_IN may be an amplifier input signal. The signal STEP_CTRL_1 and/or the signal STEP_CTRL_2 may be received by the gain step control circuit. The amplifier 102 may generate a signal (e.g., RF_OUT). The amplifier core 150 may generate the signal RF_OUT in response to the signal RF_IN. For example, the signal RF_OUT may amplify the input signal RF_IN by a vain value. The gain value may be selected by the gain control circuit 154. For example, the gain value may be selected in response to the selected input signal STEP_CTRL_1 and/or STEP_CTRL_2. The amplifier 102 may receive and/or present other signals (e.g., not shown), supply voltages and/or reference voltages. The number and/or type of signals transmitted and/or received by the amplifier 102 may be varied according to the design criteria of a particular implementation.

In one example, the amplifier core 150 may comprise a transistor Q1, a load impedance (e.g., an inductor LD), and a block (or circuit) 156. The circuit 156 may implement a bias circuit. In some embodiments, the amplifier core 150 may comprise other components. For example, the amplifier core 150 may implement a load impedance that may be switched between different values to adjust the amplifier gain (e.g., the gain value).

In an example, the transistor Q1 may be implemented as an N-type metal-oxide-semiconductor (MOS) field effect transistor (MOSFET) configured as a common source amplifier. In another example, the transistor Q1 may be implemented as an NPN bipolar junction transistor (BJT) configured as a common emitter amplifier. However, other types of transistor technology may be used to implement the amplifier 102.

The signal RF_IN may be presented to an input of the amplifier 102. An output of the amplifier 102 may present the signal RF_OUT. The input of the amplifier 102 may be coupled to a gate (or base in BJT embodiments) of the transistor Q1. The bias circuit 156 may provide a bias signal (e.g., BIAS) to the gate (or base in BJT embodiments) of the transistor Q1. A drain (or collector in BJT embodiments) of the transistor Q1 may be coupled to a first terminal of the load inductor LD and the output of the amplifier 102. A second terminal of the load inductor LD may be coupled to a supply voltage (e.g., VDD). A source (or emitter in BJT embodiments) of the transistor Q1 may be coupled to a first terminal of the source degeneration impedance 152. A second terminal of the source degeneration impedance 152 may be coupled to a negative supply voltage or a circuit ground potential.

A first input 158a of the gain control circuit 154 may receive the first control signal STEP_CTRL_1. A second input 158b of the gain control circuit 154 may receive the second control signal STEP_CTRL_2. A first terminal 158c of the gain control circuit 154 may be connected to a gate input net 160 of the amplifier core 150 coupling the gate of the transistor Q1, the bias circuit 156, and the input of the amplifier 150 (e.g., the signal RF_IN). A second terminal 158d of the gain control circuit 154 may be connected to the first terminal of the source degeneration impedance 152 (and the source of the transistor Q1). A third terminal 158e of the gain control circuit 154 may be connected to the circuit ground potential (and the second terminal of the source degeneration impedance 152).

In various embodiments, the gain control circuit 154 may comprise a block (or circuit) 170, a block (or circuit) 180, a block (or circuit) 190 and/or a block (or circuit) 192. The circuit 170 may implement a variable source degeneration impedance circuit in accordance with an example embodiment of the invention. The circuit 180 may implement a variable frequency compensation circuit in accordance with an example embodiment of the invention. The circuit 190 may implement a charge injection compensation circuit in accordance with an example embodiment of the invention. The circuit 192 may implement an inverter. The gain control circuit 154 may comprise other components (not shown). The number, type and/or arrangement of the components of the gain control circuit 154 may be varied according to the design criteria of a particular implementation.

The circuit 170 may be connected between the second terminal 158d and the third terminal 158e of the gain control circuit 154. The circuit 180 may be connected between the first terminal 158c and the second terminal 158d of the gain control circuit 154. The circuit 180 may be connected to the first terminal 158c of the gain control circuit 154.

The signal STEP_CTRL_1 may be presented to a control input 172a of the circuit 170. The signal STEP_CTRL_2 may be presented to a control input 182a of the circuit 180. A complement of the signal STEP_CTRL_2 may be presented to a control input of the circuit 190. In an example, the complement of the signal STEP_CTRL_2 may be generated by the inverter circuit 192 in response to the signal STEP_CTRL_2.

In an example, the circuit 170 may comprise a number of blocks (or circuits) 174a-174n and a block (or circuit) 176. The circuits 174a-174n may implement a variety of source degeneration impedances. In an example, the source degeneration impedances implemented by the circuits 174a-174n may be binary weighted to facilitate digital control of the gain steps. The circuit 176 may comprise a number (e.g., N) of switches corresponding to the number of the circuits 174a-174n implemented. In an example, each of the circuit 174a-174n may have a first terminal 172b connected to the second terminal 158d of the gain control circuit 154 and a second terminal connected to one of the switches of the circuit 176. The circuit 176 may comprise an output 172c configured to connect one or more of the circuits 174a-174n to the third terminal 158e of the gain control circuit 154 (e.g., the ground potential) based upon the signal STEP_C-TRL_1.

By placing one or more of the source degeneration impedances 174a-174n in parallel with the source degeneration impedance 152 in response to the signal STEP_C-TRL_1, the circuit 170 enables the signal STEP_CTRL_1 to vary the gain of the amplifier 102 in steps. In an example, the signal STEP_CTRL_1 may be multi-bit to select various combinations of the impedances 174a-174n. Each different combination of impedances may provide a different gain step. However, changing the source degeneration impedance also affects the frequency response of the amplifier core 150. The effects on frequency response due to changing the source degeneration impedance may be reduced by the frequency compensation circuit 180.

In an example, the circuit 180 may comprise a number of blocks (or circuits) 184a-184n and a block (or circuit) 186. The circuits 184a-184n may implement a variety of compensation impedances. In an example, the compensation impedances implemented by the circuits 184a-184n may be configured to compensate for the corresponding impedance changes caused by the circuit 170. The circuit 186 may comprise a number (e.g., N) of switches corresponding to the number of the circuits 184a-184n implemented. In an example, each of the circuits 184a-184n may have a first terminal 182b connected to the second terminal 158d of the gain control circuit 154 and a second terminal connected to one of the switches of the circuit 186. The circuit 186 may comprise an output 182c configured to connect one or more of the circuits 184a-184n to the gate input net 160 (e.g., via the first terminal 158d of the gain control circuit 154) based upon the signal STEP_CTRL_2. By placing one or more of the compensation impedances 184a-184n in parallel between the gate and the source of the transistor Q1 in response to the signal STEP_CTRL_2, the circuit 180 may enable the signal STEP_CTRL_2 to preserve (realign) the gain and the frequency response of the amplifier 102 over a frequency band of interest (e.g., even as the circuit 170 causes a change of impedance).

Connecting and disconnecting the compensation impedances 184a-184n may affect the bias level (e.g., voltage) on the gate input net 160 of the amplifier core 150 provided by the bias circuit 156. The effects on the bias level due to changing the compensation impedances may be reduced by the charge injection various circuit 190. In an example, the charge injection compensation circuit 190 may be configured to reduce or cancel out (nullify) an effect of charge injection on the gate input net 160 caused by switching between the compensation impedances 184a-184n (or the source degeneration impedances 174a-174n).

Figure 4:
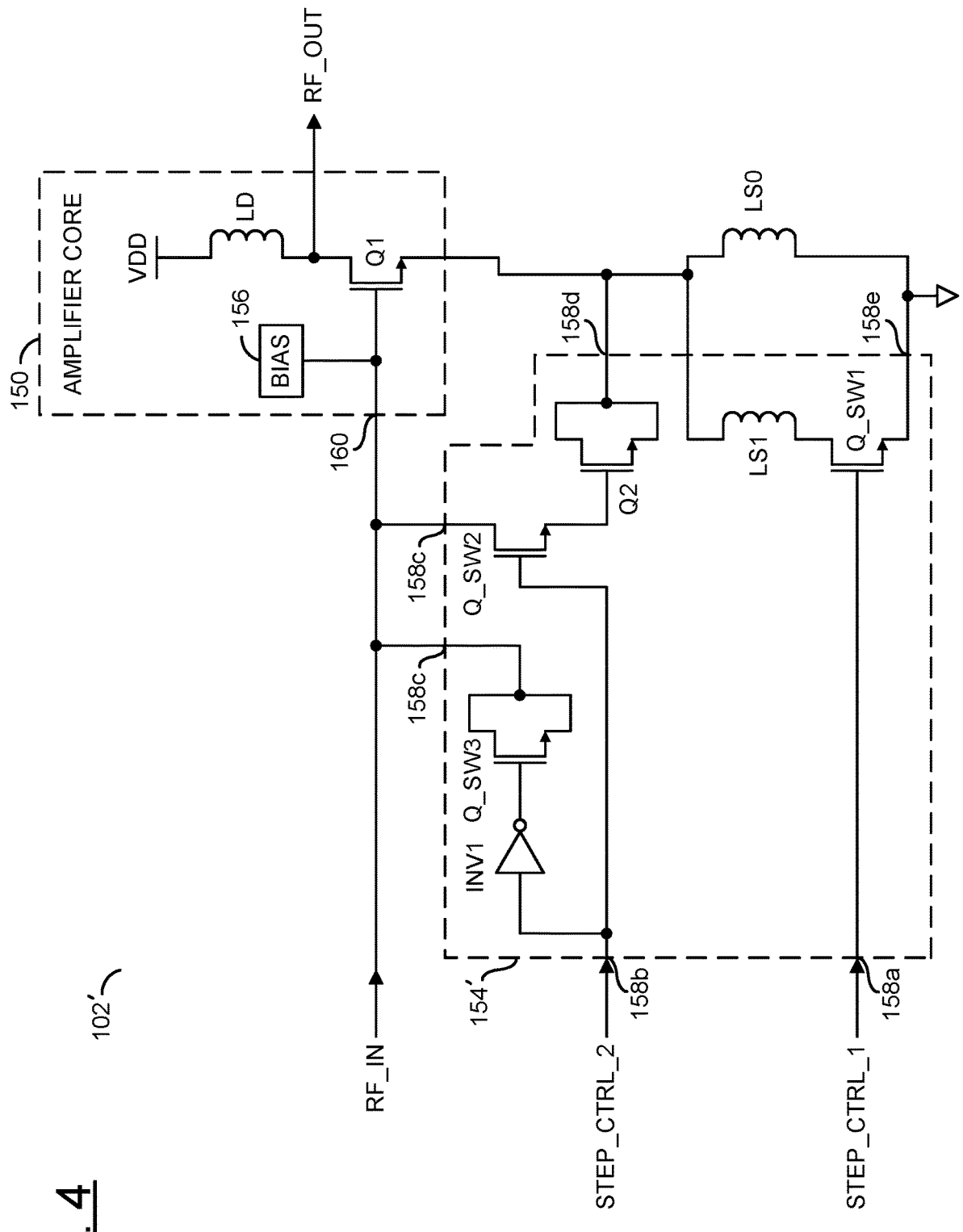
FIG. 4 is a diagram illustrating an example of a single stage amplifier circuit implementing an ultrafast and precise gain control scheme in accordance with an example embodiment of the invention.

Referring to FIG. 4, a diagram is shown illustrating an example of the amplifier circuit 102' implementing a single stage with an ultrafast and precise gain step control scheme in accordance with an example embodiment of the invention. In an example, the source degeneration impedances may be implemented as inductors and the compensation impedances may be implemented as capacitors. In an example, the source of the transistor Q1 may be coupled to a first terminal of a source degeneration inductor LS0. A second terminal of the source degeneration inductor LS0 may be connected to the circuit ground potential.

The gain control circuit 154' may be configured to provide a single gain step. In an example, the circuit 154' may comprise a source degeneration inductor LS1, a MOS transistor Q_SW1 configured as a switch, a MOS transistor Q2 configured as a capacitor, and a MOS transistor Q_SW2 configured as a switch. The circuit 154' may also implement a charge injection compensation circuit comprising a MOS transistor switch Q_SW3 and an inverter INV1. The inverter INV1 may be implemented using complementary metal-oxide-semiconductor (CMOS) technology. In one example, the MOS transistor switch Q_SW3 may be configured to complement (nullify) a charge injection of the MOS transistor switch Q_SW2. In another example, the MOS transistor switch Q_SW3 may be configured to complement (nullify) a charge injection of the MOS transistor switch Q_SW1. In yet another example, the MOS transistor switch Q_SW3 may be configured to complement (nullify) a charge injection of both the MOS transistor switch Q_SW2 and the MOS transistor switch Q_SW1.

In various embodiments, the gain step control circuit 154' may be configured to achieve one or more gain steps by connecting or disconnecting one or more additional source degeneration inductors (e.g., the inductor LS1) in parallel with the source degeneration inductor LS0. Although a single gain step implementation is illustrated, multiple gain steps may be provided by duplicating the components of the gain step control circuit 154 shown in FIG. 4. When multiple gain steps are implemented, each of the control signals STEP_CTRL_1 and STEP_CTRL_2 may be implemented as multiple signals and/or multi-bit signals.

In an example, a gain step may be achieved by controlling (e.g., enabling or disabling) the switch Q_SW1 in response to the control signal STEP_CTRL_1. When the switch Q_SW1 is enabled, both the source degeneration inductor LS1 and the source degeneration inductor LS0 are connected in parallel between the source of the amplifier transistor Q1 and the circuit ground potential. When the switch Q_SW1 is disabled, only the source degeneration inductor LS0 is effectively connected between the source of the amplifier transistor Q1 and the circuit ground potential. Depending on the state of the switch Q_SW1, the effective source degeneration inductance of the amplifier transistor Q1, will be LS0 or (LS1∥LS0).

The gain may have a linear dependence on the source degeneration inductance value. Hence, selection of the specific values for LS1 and LS0 generally sets the magnitude of the amplifier gain step. For example, the parallel configuration of the LS1 and LS0 may alter the gain of the amplifier 102' (e.g., degeneration). The gain of the amplifier may be changed by switching LS1 in and out using the switch Q_SW1. In an example, increasing the total inductance at the source may result in a lower gain step and decreasing (e.g., a parallel configuration) may result in a higher gain level.

The source degeneration inductors LS1 and LS0 may have a high degree of matching when implemented on semiconductor or organic laminate substrates. The high degree of matching may facilitate high precision of the desired gain step. In an example, the source inductors LS1 and LS0 are matched by instantiation in close proximity to one another to counteract (e.g., minimize) effects of process variation.

Further enhancement of the gain step precision is generally achieved by using a CMOS technology capacitor Q2. Switchable capacitor Q2 is generally used to offset the change in the input impedance of the transistor Q1, due to switching of the inductive degeneration LS1/LS0. In an example, the impedance of the capacitor Q1 may match the impedance of the inductance (e.g., to maintain the constant frequency when the inductance is changed). If the input impedance change of the transistor Q1 is not compensated at the time of the gain switching, the shape of the frequency response of the amplifier may change due to the nature of reactive circuits used in the input, inter-stage and output network of the RF power amplifiers, and their interaction with the input impedance of the transistor Q1.

Figure 5:
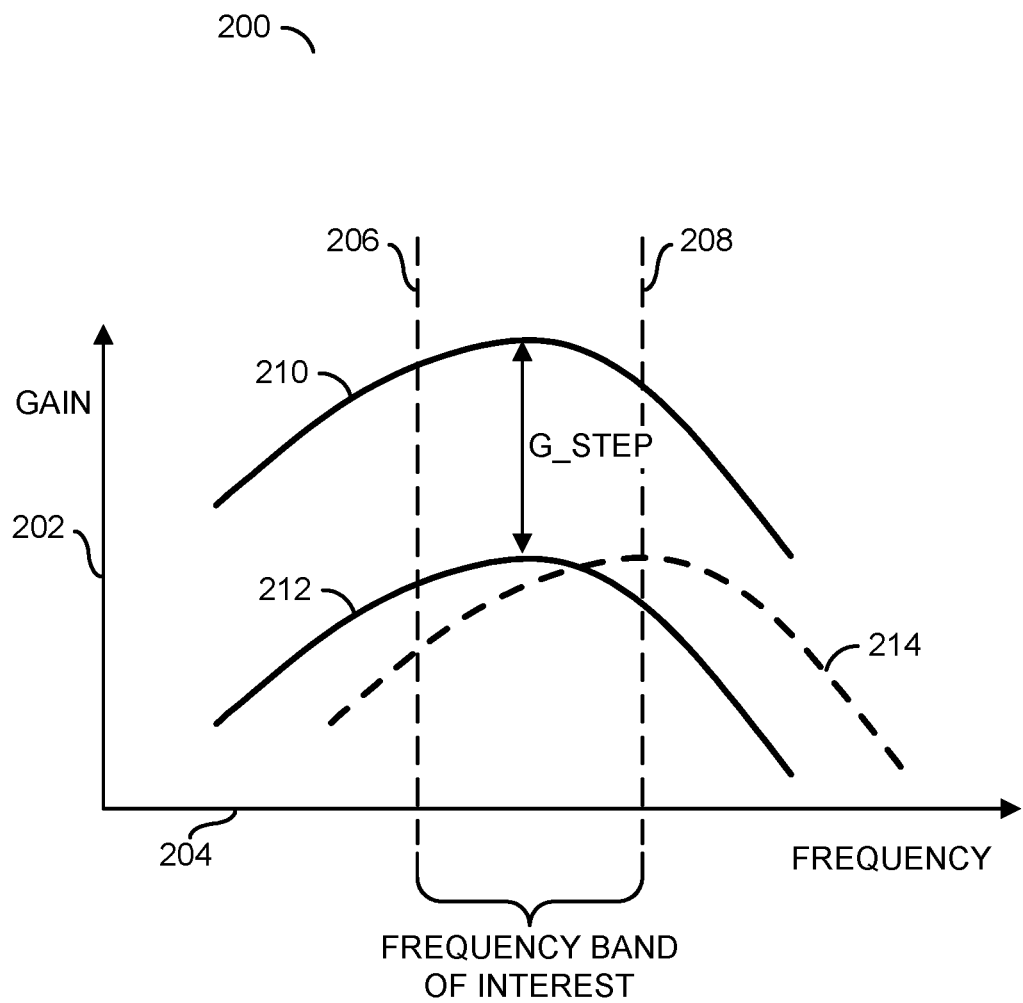
FIG. 5 is a diagram illustrating an example gain step change from a high gain state to a low gain state with and without compensation over frequency in accordance with an example embodiment of the invention.

Referring to FIG. 5, a graph 200 illustrating an example gain step change from a high gain state (or step) to a low gain state with and without compensation over frequency in accordance with an example embodiment of the invention is shown. The graph 200 may comprise an axis 202 and an axis 204. The axis 202 may represent a gain value (e.g., of the amplifier 102). The axis 204 may represent a frequency value. A vertical line 206 and a vertical line 208 are shown. The line 206 and the line 208 may represent a lower frequency value and an upper frequency value of a frequency band of interest. The frequency band of interest of the amplifier 102 may be varied according to the design criteria of a particular implementation.

The graph 200 may comprise a curve 210, a curve 212 and a curve 214. The curve 210 may represent a frequency response of the amplifier 102 in a high gain state. The curve 212 may represent a frequency response of the amplifier 102 in a low gain state. The curve 214 may represent a frequency response of the amplifier 102 in an alternate low gain state.

In the example shown, a gain change may step from the high gain state (or step or level) 210 to a low gain state (e.g., one of the curves 212 and 214). In one example, the gain step may change from the higher step 212 to the lower step (e.g., 212 or 214) when the switch Q_SW1 is deactivated (e.g., LS1 is not in parallel with LS0). As illustrated, the gain may vary over frequency band of interest. When compensation over frequency in accordance with an example embodiment of the invention is implemented, the gain variation may be similar in the high gain state 210 and the low gain state 212 over the frequency range. When compensation over frequency in accordance with an example embodiment of the invention is not implemented, the gain variation of the high gain state 210 and the low gain state 214 may not be similar over the frequency range of interest (e.g., due to frequency dependence of the amplifier gain on the source degeneration impedance). For example, without the compensation impedance 180 (or the capacitance Q2) when the switch Q_SW1 deactivates the impedance LS1, the gain may go down but the frequency may increase (e.g., from the curve 210 to the curve 214). The desired response may be the reduced gain with a constant frequency shape (e.g., from the curve 210 to the curve 212).

In various embodiments, the impedance value of the switchable compensation impedance circuit 180 (or the capacitance Q2) in accordance with an example embodiment of the invention may be set to preserve the shape of the gain of the amplifier 102 over the frequency band of interest both at high and low gain states (e.g., shifting the low gain state response from the curve 214 to the curve 212). In one example, the shape of the gain of the amplifier 102 over the frequency band of interest may be preserved by setting the impedance circuits 184a-184n. In another example, the shape of the gain of the amplifier 102' over the frequency band of interest may be preserved by setting the switchable capacitor Q2.

Figure 6:
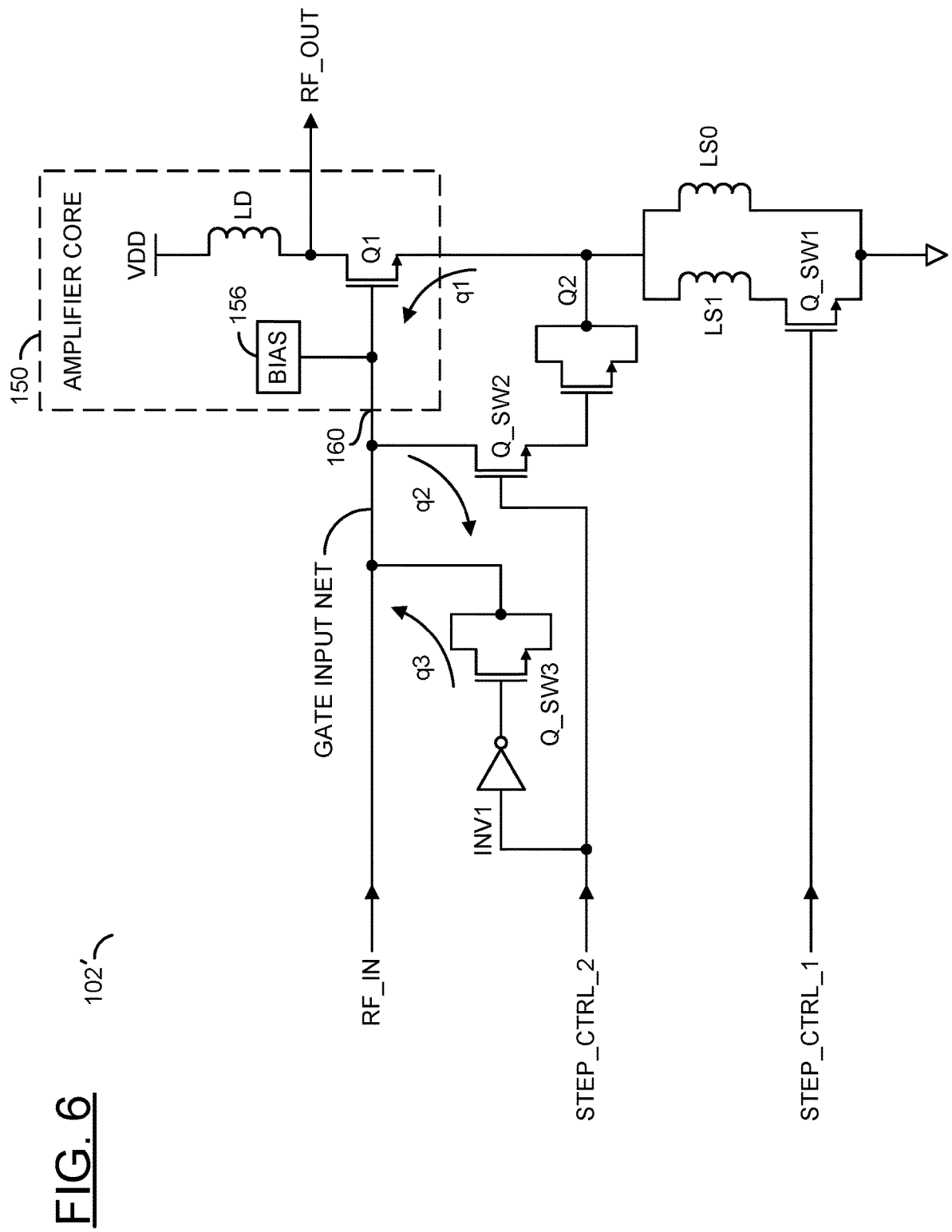
FIG. 6 is a diagram illustrating an example of charge and frequency compensation in accordance with an example embodiment of the invention.

Referring to FIG. 6, a diagram is shown illustrating an example of charge compensation in accordance with an example embodiment of the invention. Connecting or disconnecting the frequency compensating capacitor Q2 is done by the means of the switch Q_SW2. To further increase the accuracy of the gain step, the compensating capacitor Q2 may be implemented using the same device type as the amplifier transistor Q1. In the particular example in FIG. 4, n-type MOSFET devices may be used to implement both of the transistors Q1 and Q2. Matching of the device types implementing the amplifier transistor Q1 and the frequency compensating capacitor Q2 generally improves both absolute and frequency dependent precision of the gain step.

Another important performance measure of the controllable gain amplifiers and attenuators is the gain settling time duration (e.g., the time T_SETTLE shown in association with FIG. 2). Generally, reducing the time for the gain to settle to a final value is desired. Due to the capacitive nature of many types of switches, charge may be injected from the control line of the switch (e.g., Q_SW2) into the RF path to which the switch is connected at the time of switching (e.g., the gate input net 160).

In the example shown in association with FIG. 6, a charge injection q1, a charge injection q2 and a charge injection q3 are shown. Other charge injections may occur in the amplifier 102'. In an example, the charge injection q1 may be caused by the switch Q_SW1. The change in impedance caused by activating/deactivating the switch Q_SW1 may cause a drift at the gate input net 160. The drift caused by the switch Q_SW1 may be a second order impact. For example, the charge injection q1 may be generated at the gate input net 160 in response to a source-gate capacitance present on the transistor Q1, which may be large. In an example, the frequency compensation capacitor switch Q_SW2 may inject the control signal generated charge q2 into the gate input node 160 of the RF path. The frequency compensation capacitor switch Q_SW2 may draw charge from the gate input net 160. Without compensation, the injected charge q1 and/or the injected charge q2 may cause a deviation of the bias voltage on the gate input net 160, followed by a slow settling transient (e.g., to be shown in association with FIG. 8). The charge injection q3 may be generated by the switch Q_SW3 in response to the signal STEP_CTRL_2. The signal STEP_CTRL_2 may be inverted by the inverter INV1 before the gate of the transistor Q_SW3. The switch Q_SW3 may put charge onto the RF_IN line. In an example, the charge injection q3 may match (e.g., counteract) the charge injection q2 and/or the charge injection q1. Counteracting the charge injection q2 and the charge injection q1 by implementing the charge injection q3 may ensure that the net voltage change at the gate input net 160 is zero (or close to zero).

The unintended gate bias voltage deviation (e.g., caused by the charge injections q1 and q2) may cause an unwanted change in amplifier gain. The additional switch device Q_SW3 shown may be used to inject an equal amount of opposing polarity charge into the gate input net 160 of the amplifier core 150. If the amount of opposite polarity charge injected by the switch device Q_SW3 is equal to the amount of charge injected by Q_SW2 and/or Q_SW1, the bias voltage disruption may be eliminated or minimized (e.g., negligible or within an acceptable range with respect to the amplifier gain). In an example, the amount of the charge injection q3 may be defined by an equation (e.g., EQ1).

$$q3 = -q2 + q1 \quad \text{(EQ1)}$$

Reducing the bias voltage disruption may lead to faster (e.g., reduced) gain settling within the specified delta from the steady state gain value (e.g., the range G_SETTLE shown in association with FIG. 2). In an example, the charge injection characteristics of the device types of Q_SW2 and Q_SW3 may be matched. In another example, the charge injection characteristics of the device Q_SW3 may match the charge injection characteristics of the combination of the devices Q_SW2 and Q_SW1. Matching the charge injection characteristics of the device Q_SW3 with the devices Q_SW2 and Q_SW1 may reduce or eliminate bias disruption at the gate input net 160. Matching the charge injection characteristics of the device Q_SW3 with the devices Q_SW2 and Q_SW1 may improve gain step precision under constraints related to PVT variations.

The gain control circuit 154 may be configured to operate (e.g., provide fast and precise changes in gain levels while maintaining the voltage at the gate input net 160) when changing from a high impedance value to a low impedance value (e.g., at the source degeneration impedance) and/or when changing from a low impedance value to a high impedance value. For example, the gain control circuit 154 may compensate an input network of the amplifier 102 for charge injection related to changing an impedance. Generally, the source degeneration impedance (e.g., the combination of the variable source degeneration impedance circuit 170 and the source degeneration impedance 152 or the combination of the impedance LS1 and the impedance LS0) may reduce a gain of the amplifier 102 but provide a more linear response (e.g., a trade-off).

The gain control circuit 154 may enable the amplifier 102 to have a fast response. For example, if the transceiver 100 is implemented in a wireless network and, for network management an attempt is made to adjust the gain as the transceiver 100 moves closer (or farther) from a base station to prevent saturation of the ADC 52, the fast response enabled by the gain control circuit 154 may prevent information loss (e.g., dropped calls and/or intermittent signal loss during a mobile phone call). The gain control circuit 154 may enable the amplifier 102 to have a precise response. For example, the precise response may ensure a constant resolution.

Generally, the switchable capacitor Q2 (or the variable frequency compensation circuit 180) may proactively correct the frequency response. For example, when the variable source degeneration impedance circuit 170 and the source degeneration impedance 152 (or the combination of the impedance LS1 and the impedance LS0) changes the gain value from a high gain step to a low gain step (or low to high), the change in impedance that causes the gain change may also change the frequency (e.g., the frequency depends on the impedance value). The signal STEP_CTRL_2 may activate the switch Q_SW2 to activate the switchable capacitor Q2 to proactively correct the frequency response. For example, the transistor Q_SW2 and/or the switchable capacitor Q2 (or the variable frequency compensation circuit 180) may be implemented to enable a precise response to maintain a frequency response of the amplifier 102.

Generally, the switchable capacitor Q_SW3 (or the charge injection compensation circuit 190) may proactively correct the charge injection at the gate input net 160. For example, rapidly switching the gain level may deposit charge (e.g., the charge injection q2 and the charge injection q1) on the signal RF_IN (e.g., at the gate input net 160). Depositing the charge q2 and the charge q1 at the gate input net 160 may be undesirable because the gain of the amplifier core 150 may depend on the bias at the gate of the transistor Q1. The change in the bias (e.g., change of voltage) at the gate input net 160 may cause an undesired change in the gain.

The bias circuit 156 may eventually correct the bias at the gate input net 160. However, the bias circuit 156 may have a relatively large time constant (e.g., a long amount of time before the bias level is corrected). The time constant of the bias circuit 156 may not be changed arbitrarily (e.g., the time constant may be defined by other characteristics of the amplifier 102 such as a filtering bias, the size of transistors, RF components, inductors and capacitors used, etc.). Since the charge injection q2 and the charge injection q1 may affect the gain in a pre-determined fashion (e.g., resulting from a change in impedance), the charge injection q3 may be implemented to eliminate the cause of the bias disturbance while leaving the time constant alone (e.g., provide compensation without disturbing other characteristics of the transceiver 100). For example, the gain control circuit 154 may be configured to compensate for the voltage deviation of the bias level and/or a transient at the gate input net 160 before a time constant of the bias circuit 156.

The signal STEP_CTRL_2 may be inverted to activate the switch Q_SW3 to proactively inject the charge q3. For example, the switchable capacitor Q_SW3 (or the charge injection compensation circuit 190) may be implemented to enable a fast response. Proactively correcting the charge injection at the gate input net 160 may eliminate the disruption caused by the bias (or voltage change) faster than waiting for the time constant of the bias circuit 156.

Since the time constant of the bias circuit 156 may be difficult to change (e.g., changing the time constant may have side-effects corresponding to noise and filtering), the transistor Q_SW3 may be configured to prevent, correct and/or compensate the change in bias at the gate input net 160. The transistor Q_SW3 and the transistor Q_SW2 may be generally matched but have some differences. For example, the transistor Q_SW3 and the transistor Q_SW2 may have the same process size but have different characteristics. Any time a change is made to the circuit 102 (e.g., impedance changes), charge injections may occur. Since the transistor Q_SW3 and the transistor Q_SW2 have different connections and the transistor Q_SW1 may additionally cause changes to the circuit 102, the charge characteristics of the transistor Q_SW3 may match the ratio of charge characteristics of the transistor Q_SW2 and the transistor Q_SW1.

The gain control circuit 154' may be configured to solve additional problems associated with changing the impedance. For example, switching in and out the inductive degeneration LS1/LS0 may result in a change in gain. The change in gain may result in a change in frequency (e.g., since reactive components are used). The compensation capacitance Q2 may be activated/deactivated using the switch Q_SW2 at the same time as the switch Q_SW1 is activated/deactivated. The compensation capacitance Q2 may be a transistor configured as a capacitor that is switched on/off using the switch Q_SW2. For example, the capacitance of the compensation capacitor Q2 may be selected to be the exact amount of capacitance that would correct the gain shift over frequency during the gain step.

The compensation capacitance Q2 may fix the frequency shift problem, but activating the compensation capacitance Q2 using the switch Q_SW2 may introduce an additional problem. The switch Q_SW2 may draw some charge to/from the gate input net 160. For example, the signal STEP_CTRL_2 may be a square wave control signal. Some of the square wave voltage may discharge into the gate of the switch transistor Q_SW2 and into gate input net 160. The gate input net 160 may connect to the input of the amplifier core 150. The input of the amplifier core 150 may have a specific DC bias (e.g., a DC voltage value). The change introduced by the switch Q_SW2 at the gate input net 160 may cause the voltage to deviate. The voltage deviation may affect the process and/or the gain (e.g., the settling time).

The switch Q_SW3 may be implemented to fix the charge at the gate input net 160. The switch Q_SW3 may have a similar implementation as the switch Q_SW2 (e.g., a similarly sized transistor). The switch Q_SW3 may not work as a switch. For example, the switch Q_SW3 may have both terminals connected to the gate input net 160 and receive the exact opposite control signal (e.g., the signal STEP_C-TRL_2 inverted by the inverter INV1) to provide a similar charge in the opposite direction. As the charge injection q2 from the switch Q_SW2.

The gain control circuit 154' may implement the switch Q_SW3 so that the net charge (e.g., q1+q2+q3) is going to be zero (e.g., up to the accuracy of the components of the amplifier 102' close to zero). The variable source degeneration impedance, the variable frequency compensation impedance and/or the charge compensation implemented by the gain control circuit 154' may enable an ultra-fast settling time (e.g., a matter of nanoseconds). In one example, the charge compensation implemented by the gain control circuit 154' may correct the voltage bias at the input of the amplifier core 150 within approximately 50 ns. Without the compensation by the gain control circuit 154' the DC voltage at the gate input net 160 may be disturbed and the bias circuit 156 may correct the voltage bias in approximately 500 ns (e.g., depending on the time constant of the bias circuit 156 the correction time without compensation may be 10× greater or more).

The gate input net 160 may have a high impedance. For example, the impedance of the gate input net 160 may depend on the biasing scheme. Generally, the transistor Q1 may have a high capacitance and/or the amplifier core 150 may comprise additional capacitors not shown (e.g., lots of reactance). Since the time constant of the bias circuit 156 is arbitrary, and may not be changed easily, the gain control circuit 154 may correct the cause of the voltage deviation at the gate input net 160 without affecting other aspects of the amplifier 102'. For example, the charge compensation implemented by the gate input net 160 may eliminate the cause of the disturbance (e.g., the injected charges q2 and q1) while leaving the time constant alone.

The switch Q_SW2 controls the capacitance that shifts the frequency back to the frequency band of interest when the gain value is changed to the lower gain step. The transistor Q_SW3 compensates for the charge q1 caused by the switch Q_SW1 in addition to the charge q2 caused by the switch Q_SW2. Generally, most of the charge compensation implemented by the transistor Q_SW3 is for the disturbance caused by the switch Q_SW2 (e.g., q2). The transistor Q_SW3 (or the charge injection compensation circuit 190) may be configured to compensate for all switches to attempt to achieve a zero net gain at the gate input net 160. The gain control circuit 154 may be configured to maintain the bias voltage at the gate input net 160 (e.g., as closed to fixed as possible to avoid variations over time). For example, the gain control circuit 154 may provide a net zero change in charge at the gate input net 160 (e.g., in response to the charge q2 and the charge q1). The net zero change may provide a constant charge at the gate input net 160 when an impedance of the amplifier 102 is changed.

The gain control circuit 154 may be configured to keep the bias voltage at the gate input net 160 constant. To keep the bias voltage at the gate input net 160 constant, the charge injection compensation circuit 190 may be configured to cancel out the disturbances (e.g., the charge q1 and/or the charge q2) resulting from changes in impedance. The compensating switch Q_SW3 may be configured to keep the voltage at the gate input net 160 constant. In one example, the switch Q_SW3 (or the charge injection compensation circuit 190) may compensate for the disturbance (e.g., the charge q2) caused by the switch Q_SW2. In another example, the switch Q_SW3 (or the charge injection compensation circuit 190) may compensate for the overall charge injection on the gate input net 160 and keep the voltage constant.

Figure 7:
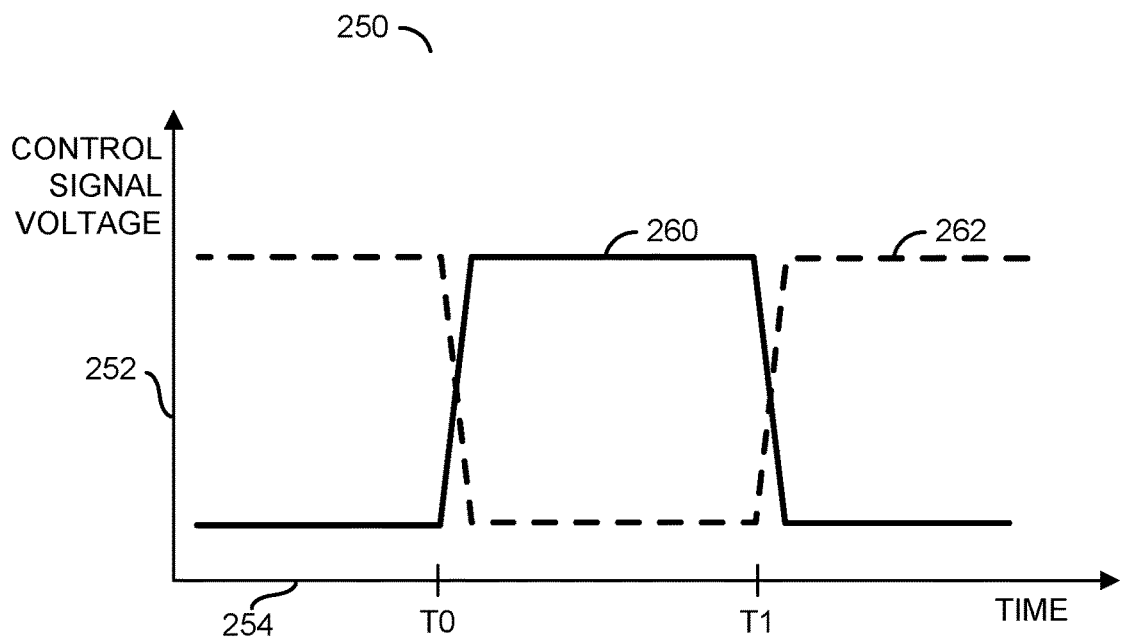
FIG. 7 is a diagram illustrating control of charge compensation in accordance with an example embodiment of the invention.

Referring to FIG. 7, a diagram illustrating a graph 250 of a control of charge compensation in accordance with an example embodiment of the invention is shown. The graph 250 may comprise an axis 252 and an axis 254. The axis 252 may represent a voltage of a control signal. The axis 254 may represent an amount of time.

A curve 260 and a curve 262 are shown. The curve 260 may represent the control signal STEP_CTRL_2. The curve 262 may represent the inverted version of the signal STEP_CTRL_2. For example, the curve 262 may be the output of the inverter 192 (or the inverter INV1 shown in association with FIG. 6) provided to the charge injection circuit 190. In the example shown, the curve 260 and the curve 262 may generally be a square wave control signal having two states (e.g., a high state and a low state). The voltage level of the high state and the low state may be varied according to the design criteria of a particular implementation. The transition from high to low or low to high for the signal STEP_CTRL_2 may indicate that the changes in gain (e.g., and the resulting change in bias at the gate input net 160) may occur quickly.

The charge injection compensation switch Q_SW3 and the frequency compensation capacitor switch Q_SW2 are generally controlled by complementary control signals during the amplifier gain switching. In an example embodiment, the control signal STEP_CTRL_2 (e.g., the curve 260) presented to the frequency compensation capacitor switch Q_SW2 may be inverted (e.g., using the CMOS inverter 192) and the inverted version (e.g., curve 262) may be presented to the charge injection compensation switch Q_SW3. By inverting the control signal STEP_CTRL_2, the charge injection circuit 190 may compensate for at least the charge injected by the frequency compensation circuit 180.

Figure 8:
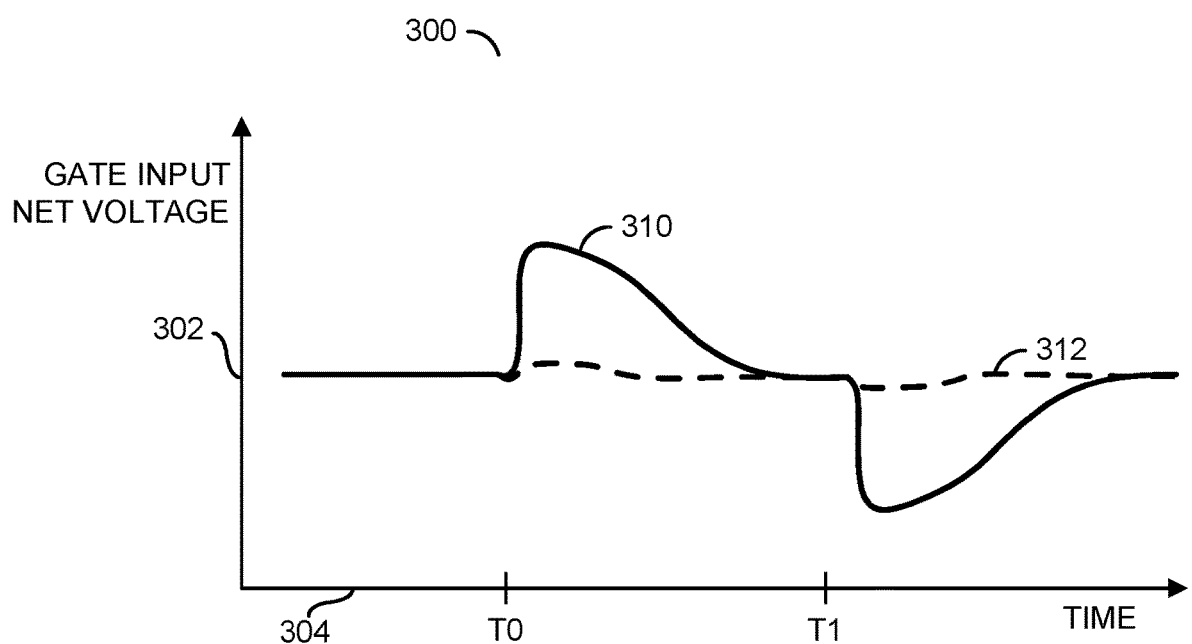
FIG. 8 is a diagram illustrating reduction in bias disruption provided by charge compensation in accordance with an example embodiment of the invention.

Referring to FIG. 8, a diagram illustrating a graph 300 of a reduction in bias disruption provided by the charge compensation in accordance with an example embodiment of the invention is shown. The graph 300 may comprise an axis 302 and an axis 304. The axis 302 may represent a voltage of the gate input net 160. The axis 304 may represent an amount of time.

The graph 300 may comprise a curve 310 and a curve 312. The curve 310 may represent the amplifier gate bias voltage in an uncompensated charge injection scenario. The curve 312 may represent the amplifier gate bias voltage when implementing the embodiments of the invention.

In an example, the solid line 310 may illustrate how the amplifier gate bias voltage may deviate due to uncompensated charge injection into the gate input net 160 by the frequency compensation capacitor switch Q_SW2. In the example shown, the solid line 310 may illustrate a deviation of the bias voltage (e.g., at the time T0) of the gate input net 160, followed by a slow settling transient (e.g., at the time T1).

In another example, the dashed line 312 may illustrate how bias disruption may be minimized by injecting the complimentary polarity charge into the same gate input net 160 using the charge injection compensation switch Q_SW3. The dashed line 312 may represent an output at the gate input net 160 when embodiments of the invention are implemented. The deviation of the dashed line 312 at the time T0 is less (or negligible) compared to the deviation of the solid line 310 at the time T0. Similarly, at the time T1, the transient of the dashed line 312 may be less (or negligible) compared to the transient of the solid line 310 at the time T1. For example, the dashed line 312 (e.g., with the charge compensation) may have a fast transient compared to the uncompensated line 310. In general, compensation of charge injection into the sensitive RF amplifier input nets due to gain switching may be used in a wide range of gain step implementation architectures and is not limited to the particular example illustrated by FIG. 6.

Although a method of gain step control comprising compensation over frequency and compensation of charge injection in accordance with example embodiments of the invention has been illustrated using source (emitter) degeneration impedances of an amplifier, the method may also be applied to the drain (collector) side of the amplifier. In an example, the load impedance (e.g., inductor LD) may be switched between different values to change the amplifier gain. A gain control circuit in accordance with example embodiments of the invention may be connected between the gate (base) and the drain (collector) of the transistor Q1 and configured in accordance with the teachings herein to provide compensation over frequency and compensation of charge injection in accordance with example embodiments of the invention.

Figure 9:
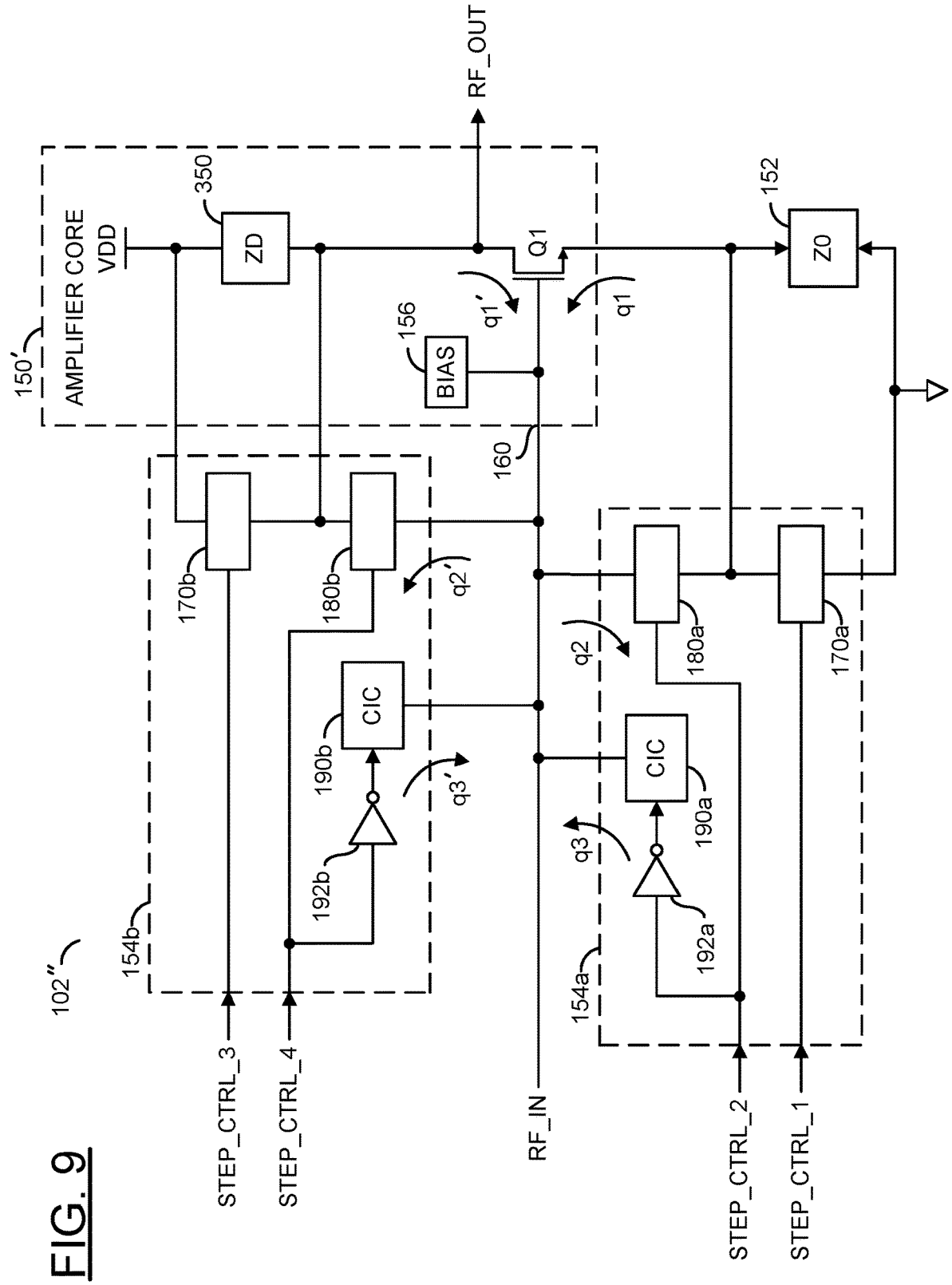
FIG. 9 is a diagram illustrating an example embodiment implementing the gain control circuit for a source degeneration impedance and a gain control circuit for a load impedance is shown.

Referring to FIG. 9, a diagram illustrating an example embodiment 102″ implementing the gain control circuit 154a for a source degeneration impedance and a gain control circuit 154b for a load impedance is shown. The amplifier core 150′ is shown. The amplifier core 150′ may comprise a block (or circuit) 350. The circuit 350 may implement a load impedance (e.g., ZD). In one example (e.g., as shown in association with FIG. 6), the load impedance 350 may be the inductor LD. In example, the amplifier 102″ may be implemented with the gain control circuit 154a but not the gain control circuit 154b (e.g., as shown in association with FIG. 3). In another example, the amplifier 102″ may be implemented with the gain control circuit 154b but not the gain control circuit 154a. In the example shown, the amplifier 102″ may be implemented with both the gain control circuit 154a and the gain control circuit 154b. The implementation of the amplifier 102″ may be varied according to the design criteria of a particular implementation.

The gain control circuit 154a is shown comprising the variable impedance 170a, the variable frequency compensation circuit 180a, the charge injection compensation circuit 190a and/or the inverter 192a. The variable impedance 170a may be connected in parallel with the source degeneration impedance 152. In an example, the variable impedance 170a may be configured to implement the variable source degeneration impedance.

Similarly, the gain control circuit 154b is shown comprising the variable impedance 170b, the variable frequency compensation circuit 180b, the charge injection compensation circuit 190b and/or the inverter 192b. The variable impedance 170b may be connected in parallel with the load impedance 350. In an example, the variable impedance 170b may be configured to implement the variable load impedance.

The source degeneration gain control circuit 154a is shown receiving the input signal STEP_CTRL_1 and the input signal STEP_CTRL_2. The signal STEP_CTRL_1 may be configured to select the gain level (or step) for the source degeneration gain. For example, the signal STEP_CTRL_1 may select the impedance value for the variable source degeneration impedance 170a. The parallel configuration of the source degeneration impedance 152 and the variable source degeneration impedance 170a may adjust the source degeneration gain of the amplifier core 150′. Changing the impedance by selecting the gain level using the signal STEP_CTRL_1 may cause a charge drift. The charge q1 is shown being injected at the gate input net 160 of the amplifier core 150′ (e.g., caused by the capacitance of the source and gate of the transistor Q1).

The signal STEP_CTRL_2 may be configured to select an impedance value for the variable frequency compensation impedance 180a (e.g., a capacitance). Since the change in impedance caused by changing the variable source degeneration impedance 170a causes a frequency shift, the signal STEP_CTRL_2 may select an impedance value for the variable frequency compensation impedance 180a to prevent the frequency shift. Changing the impedance value of the variable frequency compensation impedance 180a may cause the injection of the charge q2 at the gate input net 160.

The charge injection compensation circuit 190a and the inverter 192a may be configured to nullify the charge injection q1 and the charge injection q2. The inverter 192a may invert the signal STEP_CTRL_2 to provide a charge opposing the charge q2. The charge injection compensation circuit 190a may inject the charge q3 at the gate input net 160. The charge injection compensation circuit 190a may inject the charge q3 to pre-condition (or compensate or maintain) the bias voltage level at the gate input net 160 for the charge injection q2 caused by the variable frequency compensation circuit 180a and the charge injection q1 caused by the variable source degeneration impedance 170a.

The load impedance gain control circuit 154b may have a similar implementation as the source degeneration gain control circuit 154a. The load impedance gain control circuit 154b is shown receiving an input signal (e.g., STEP_CTRL_3) and an input signal (e.g., STEP_CTRL_4). The signal STEP_CTRL_3 may be configured to select the gain level (or step) for the load gain. For example, the signal STEP_CTRL_3 may select the impedance value for the variable load impedance 170b. The parallel configuration of the load impedance 350 and the variable load impedance 170b may adjust the load gain of the amplifier core 150'. Changing the impedance by selecting the gain level using the signal STEP_CTRL_3 may cause a charge drift. The charge q1' is shown being injected at the gate input net 160 of the amplifier core 150' (e.g., caused by the capacitance of the drain and gate of the transistor Q1).

The signal STEP_CTRL_4 may be configured to select an impedance value for the variable frequency compensation impedance 180b (e.g., a capacitance). Since the change in impedance caused by changing the variable load impedance 170b causes a frequency shift, the signal STEP_CTRL_4 may select an impedance value for the variable frequency compensation impedance 180b to prevent the frequency shift. Changing the impedance value of the variable frequency compensation impedance 180b may cause the injection of the charge q2' at the gate input net 160.

The charge injection compensation circuit 190b and the inverter 192b may be configured to nullify the charge injection q1' and the charge injection q2'. The inverter 192b may invert the signal STEP_CTRL_4 to provide a charge opposing the charge q2'. The charge injection compensation circuit 190b may inject the charge q3' at the gate input net 160. The charge injection compensation circuit 190b may inject the charge q3' to pre-condition (or compensate or maintain) the bias voltage level at the gate input net 160 for the charge injection q2' caused by the variable frequency compensation circuit 180b and the charge injection q1' caused by the variable load impedance 170b.

The source degeneration gain control circuit 154a may cause the charge injection q1 and q2 on the gate input net 160. The source degeneration gain control circuit 154a may inject the compensation charge q3 on the gate input net 160 to nullify the effects (e.g., the voltage deviation) caused by the charge q2 and q1. The load gain control circuit 154b may cause the charge injection q1' and q2' on the gate input net 160. The load gain control circuit 154b may inject the compensation charge q3' on the gate input net 160 to nullify the effects (e.g., the voltage deviation) caused by the charge q2' and q1'. In some embodiments, the gain control circuits 154a-154b may work independently from each other to balance the charge at the gate input net 160 (e.g., the charge q3 may be generated by the gain control circuit 154a to nullify the effects of the charge q2 and q1 and the charge q3' may be generated by the gain control circuit 154b to nullify the effects of the charges q2' and q1'). In some embodiments, the gain control circuits 154a-154b may operate together to ensure a balanced charge on the gate input net 160 (e.g., the gain control circuits 154a-154b may generate the charges q3 and q3' to nullify the effects of the charges q1, q1', q2 and q2').

The functions performed by the diagrams of FIGS. 1-9 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an amplifier configured to provide multiple gain steps; and
a gain control circuit configured to provide fast and precise changes between the multiple gain steps of said amplifier, wherein said gain control circuit is further configured to (i) change an impedance of said amplifier to switch between said gain steps, (ii) compensate for changes in frequency response related to changing said impedance and (iii) inject a complementary charge to an input of said amplifier to correct a bias voltage deviation and a transient caused by said gain control circuit.

2. The apparatus according to claim 1, wherein correcting said bias voltage deviation and said transient reduces a gain settling time of an output of said amplifier.

3. The apparatus according to claim 1, wherein correcting said bias voltage deviation and said transient is implemented by compensating an input network of said amplifier for charge injection related to changing said impedance.

4. The apparatus according to claim 1, wherein said impedance of said amplifier that is changed to switch between said gain steps comprises at least one of a source degeneration inductance, or a load inductance, or both said source degeneration inductance and said load inductance.

5. The apparatus according to claim 1, wherein said gain control circuit is further configured to:
change said gain steps of said amplifier by switching between two or more impedances in response to a first control signal; and
switch between two or more compensation impedances in response to a second control signal.

6. The apparatus according to claim 5, wherein said gain control circuit is further configured to utilize a complementary version of said second control signal to compensate an input net of said amplifier for charge injection related to switching between said compensation impedances.

7. An apparatus comprising:
an impedance circuit configured to select a first impedance to vary an impedance value of an amplifier to switch between gain steps of said amplifier;
a frequency compensation circuit configured to select a second impedance to maintain a frequency response of said amplifier when said impedance value is varied; and
a charge injection compensation circuit configured to maintain a bias level at a gate input net of said amplifier when said second impedance is adjusted, wherein (a) adjusting said second impedance causes a first charge injection on said gate input net and (b) said charge injection compensation circuit maintains said bias level by injecting a second charge on said gate input net to eliminate a disturbance to said bias level caused by said first charge injection.

8. The apparatus according to claim 7, wherein said impedance value of said amplifier varied by said impedance circuit is a source degeneration inductance.

9. The apparatus according to claim 7, wherein said impedance value of said amplifier varied by said impedance circuit is a load impedance of said amplifier configured to switch between different levels of gain of said amplifier.

10. The apparatus according to claim 7, wherein (a) said first impedance is selected in response to a first control signal, (b) said second impedance is selected in response to a second control signal and (c) said second charge on said gate input net is injected in response to a complementary version of said second control signal.

11. The apparatus according to claim 7, wherein said second charge compensates for a voltage deviation of said bias level and a transient at an input of said amplifier before a time constant of a bias circuit of said amplifier.

12. The apparatus according to claim 7, wherein (i) varying said impedance value causes a third charge injection on said gate input net and (ii) said charge injection compensation circuit is further configured to provide a net zero change in charge at said gate input net in response to said first charge injection and said third charge injection.

13. The apparatus according to claim 7, wherein said charge injection compensation circuit is further configured to provide a constant charge at said gate input net when an impedance of said amplifier is changed.

14. The apparatus according to claim 7, wherein said first impedance is an inductance and said second impedance is a capacitance that matches said inductance.

15. The apparatus according to claim 14, wherein said capacitance is implemented to correct a gain shift caused by said inductance to provide a constant frequency when changing to a different one of said gain steps.

16. An apparatus comprising:
a circuit configured to generate an output signal in response to an input signal and a gain value, wherein said circuit amplifies said input signal by said gain value; and
a gain control circuit configured to (i) select a first impedance to change said gain value to one of multiple gain steps, (ii) select a second impedance to prevent a frequency change in response to changing said first impedance and (iii) inject a charge on said input signal to prevent a change in voltage bias caused by said gain control circuit, wherein said apparatus provides fast and precise changes to said gain value of said circuit when changing between said multiple gain steps.

17. The apparatus according to claim 16, further configured to provide an ultrafast and precise gain control step in RF amplifiers.

18. The apparatus according to claim 16, wherein said first impedance is a source degeneration inductance.

19. The apparatus according to claim 16, wherein said first impedance is a load impedance configured to switch between different levels of gain of said circuit.

20. The apparatus according to claim 16, wherein (a) said first impedance is selected in response to a first control signal, (b) said second impedance is selected in response to a second control signal and (c) said charge on said input signal is injected in response to a complementary version of said second control signal.

* * * * *